United States Patent [19]

Shen et al.

[11] Patent Number: 5,138,198

[45] Date of Patent: Aug. 11, 1992

[54] INTEGRATED PROGRAMMABLE LOGIC DEVICE WITH CONTROL CIRCUIT TO POWER DOWN UNUSED SENSE AMPLIFIERS

[75] Inventors: Ju Shen, San Jose; Albert L. Chan, Palo Alto; Chan-Chi J. Cheng, San Jose, all of Calif.

[73] Assignee: Lattice Semiconductor Corporation, Hillsboro, Oreg.

[21] Appl. No.: 695,180

[22] Filed: May 3, 1991

[51] Int. Cl.$^5$ .......................................... H03K 19/177
[52] U.S. Cl. ................... 307/465; 307/296.3; 307/468; 307/530
[58] Field of Search ............... 307/465, 468, 469, 530, 307/296.3

[56] References Cited

U.S. PATENT DOCUMENTS

| | | | |
|---|---|---|---|
| 4,645,953 | 2/1987 | Wong | 307/465 X |
| 4,725,745 | 2/1988 | Kondo et al. | 307/465 |
| 4,783,606 | 11/1988 | Goetting | 307/468 X |
| 4,959,564 | 9/1990 | Steele | 307/465 |
| 4,963,769 | 10/1990 | Hiltpold et al. | 307/296.3 X |

Primary Examiner—David Hudspeth
Attorney, Agent, or Firm—Skjerven, Morrill, MacPherson, Franklin & Friel

[57] ABSTRACT

A programmable logic device is disclosed which includes sense amplifiers for determining the programmed/unprogrammed state of product terms coupled to respective ones of the sense amplifiers. A control circuit is provided for the sense amplifiers to permit, under control from a control signal, disabling sense amplifiers which are not being used in the achievement of the logical function of the programmable logic device to avoid unnecessary use of current by the sense amplifiers which are not operative for the function being implemented. In addition to eliminating current drain by the unused sense amplifier, the control circuit also ensures that a low output signal will always be provided at the output of the disabled sense amplifier to avoid potentially indicating an incorrect logical output from the sense amplifier which is connected to other devices in the programmable logic device.

10 Claims, 3 Drawing Sheets

INTEGRATED PROGRAMMABLE LOGIC DEVICE WITH CONTROL CIRCUIT TO POWER DOWN UNUSED SENSE AMPLIFIERS

BACKGROUND OF THE INVENTION

1. Field of the Invention

This invention relates to programmable logic devices, and more particularly to a programmable logic device utilizing sense amplifiers which may be powered down to eliminate the current draw from the unused sense amplifier.

2. Description of the Prior Art

Programmable logic devices are known in the prior art and an example of one such devices is illustrated in U.S. Pat. No. 4,833,646 issued to John E. Turner on May 23, 1989 and assigned to the assignee of the present invention. The Turner patent is incorporated herein by reference in its entirety.

As for the background, attention is directed to FIG. 1 herein wherein a highly simplified, partial diagram of a programmable logic device is illustrated. Programmable logic device 1 is illustrated in highly simplified form in FIG. 1, and includes programmable AND 5 array 2, sense amplifiers designated SA1-SA6 and a six input OR gate 3. Logical inputs A, B and C are illustrated, although in a commercial programmable logic device typically a greater number of logical inputs would be utilized. Through the use of buffer inverters 5, 6 and 7, logical inputs A, $\overline{A}$, B, $\overline{B}$ and C, $\overline{C}$ are connected to array lines 8-13 using respectively. Product term lines PT1-PT6 may be selectively connected to array lines 8-13 using the memory cells which are located at the intersection of the array liens and product term lines, these memory cells being indicated by an X. The memory cells utilized in programmable AND array 2, may be of the type illustrated in the above-identified Turner patent. By programming a memory cell at the intersection of an array line and a product term line, the logical inputs to the programmable logic device are provided to the product term lines corresponding to the intersection between the array line and the product term line as programmed. A sense amplifier is connected to each product term line and is used to sense the programmed-/unprogrammed state of the memory cells connected to the product term line. Using circuitry of the type illustrated in the Turner patent, the state of each memory cell may be determined. Sense amplifiers SA1 through SA6 may be of the type illustrated in FIG. 5 of the above-identified Turner patent. The outputs of sense amplifiers SA1-SA6 are inputs to OR gate 3, and output terminal 15 of OR gate provides the logical sum output indicating the result of logical input signals to the programmed logic device 1.

In the prior art programmable logic device 1, if a product term is not going to be used to implement the logical function programmed for the logic device, that is the logical input to OR gate 3 will always be in the low condition for that product term, the sense amplifier associated with that product term is nevertheless retained in the circuit and draws current. Thus in a high density programmable logic device if there are a significant number of unused product terms, then a correspondingly significant number of sense amplifiers would remain operable and the current consumption would be unnecessarily high. For example, in programmable logic device 1, if product term PT1 is not used in the logical function being implemented, to maintain the output of sense amplifier SA1 low, the true and complement cells for product term line PT1 are all programmed to insure that the output of sense amplifier SA1 will always be low. Accordingly, sense amplifier SA1 even though not utilized in the logical function will always be in operation and continue consuming a current.

SUMMARY OF THE INVENTION

An object of the present invention is to provide an integrated programmable logic device requiring less power than programmable logic devices of the prior art.

Another object of the present invention is to provide a sense amplifier circuit which includes a control circuit for disabling the sense amplifier in response to an external control signal.

Another object of the present invention is to provide a high speed sense amplifier circuit which may be disabled in response to a control signal, with the high speed sense amplifier circuit utilizing in the first stage a feedback transistor having a negative threshold voltage to provide fast switching operation.

In accordance with the present invention an integrated programmable logic device is provided which comprises a plurality of array lines for connection to a plurality of logical input signals, a plurality of product terms, an array of programmable memory cells arranged in rows and columns for selectively connecting respective array lines to corresponding product terms, a plurality of sense amplifiers, one associated with each of the product terms, with the sense amplifiers having a control circuit which in response to a control signal having first and second states, either allows the sense amplifier to function to indicate the programmed/unprogrammed state of the memory cells associated with the product term, or in accordance with a control signal of another state causes the sense amplifier to provide at its output a logic signal having only one state.

Further in accordance with the present invention, the control circuit of the sense amplifier includes a first field effect transistor connected to a first stage of the sense amplifier for selectively enabling or disabling the first stage to cause the output signal from the first stage to either respond to the input to the sense amplifier or rise to a first predetermined voltage and the control circuit further includes a second field effect transistor which in response to the receipt of the control signal enables or disables a second stage of the sense amplifier to cause the output of the second stage of the sense amplifier to either respond to the input of the sense amplifier or to always exhibit a low output regardless of the input signal provided to the sense amplifier.

DETAILED DESCRIPTION OF THE PREFERRED EMBODIMENTS

Figure 1:
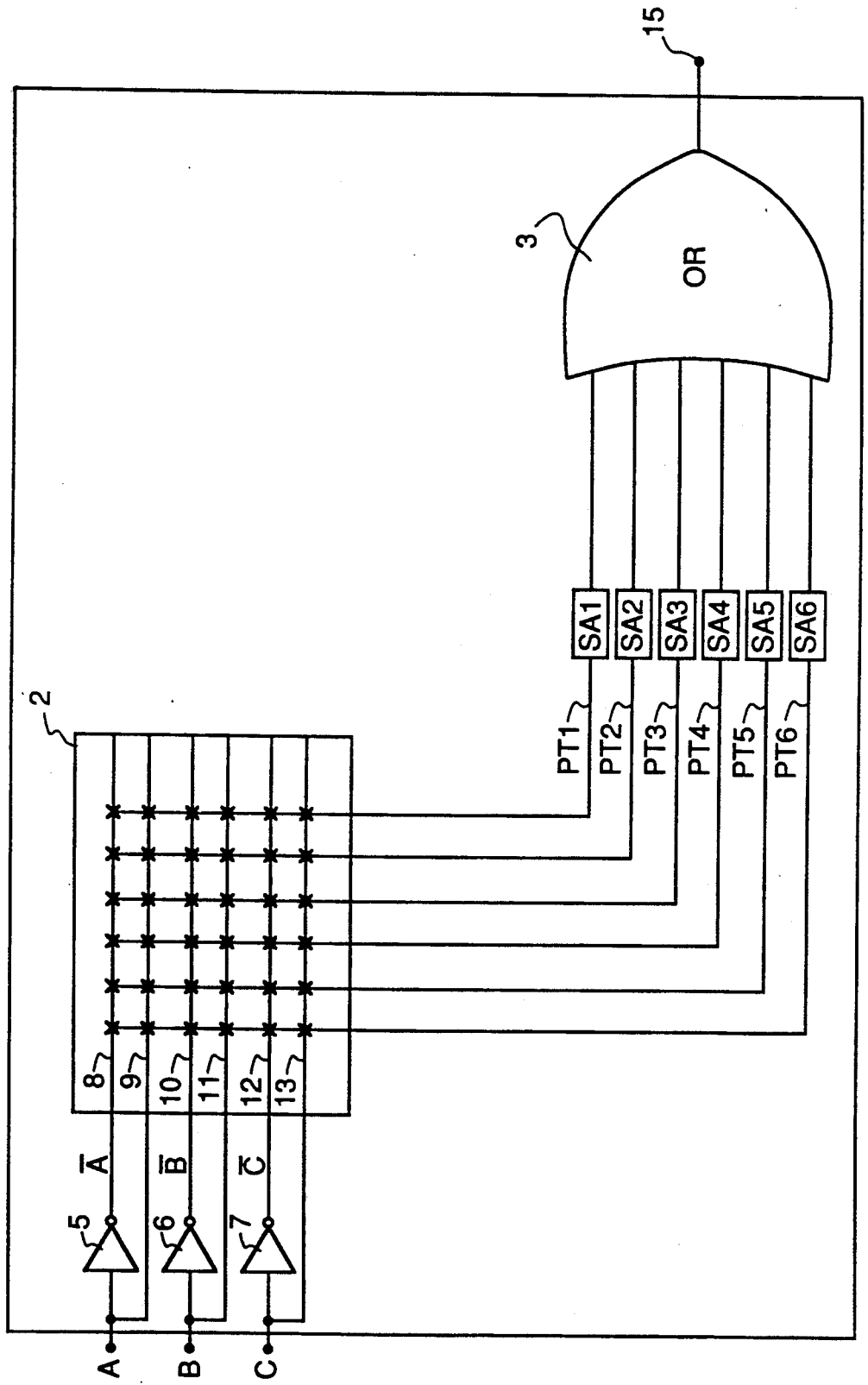
FIG. 1 illustrates in highly simplified form a programmable logic device in accordance with the prior art.
Figure 2:
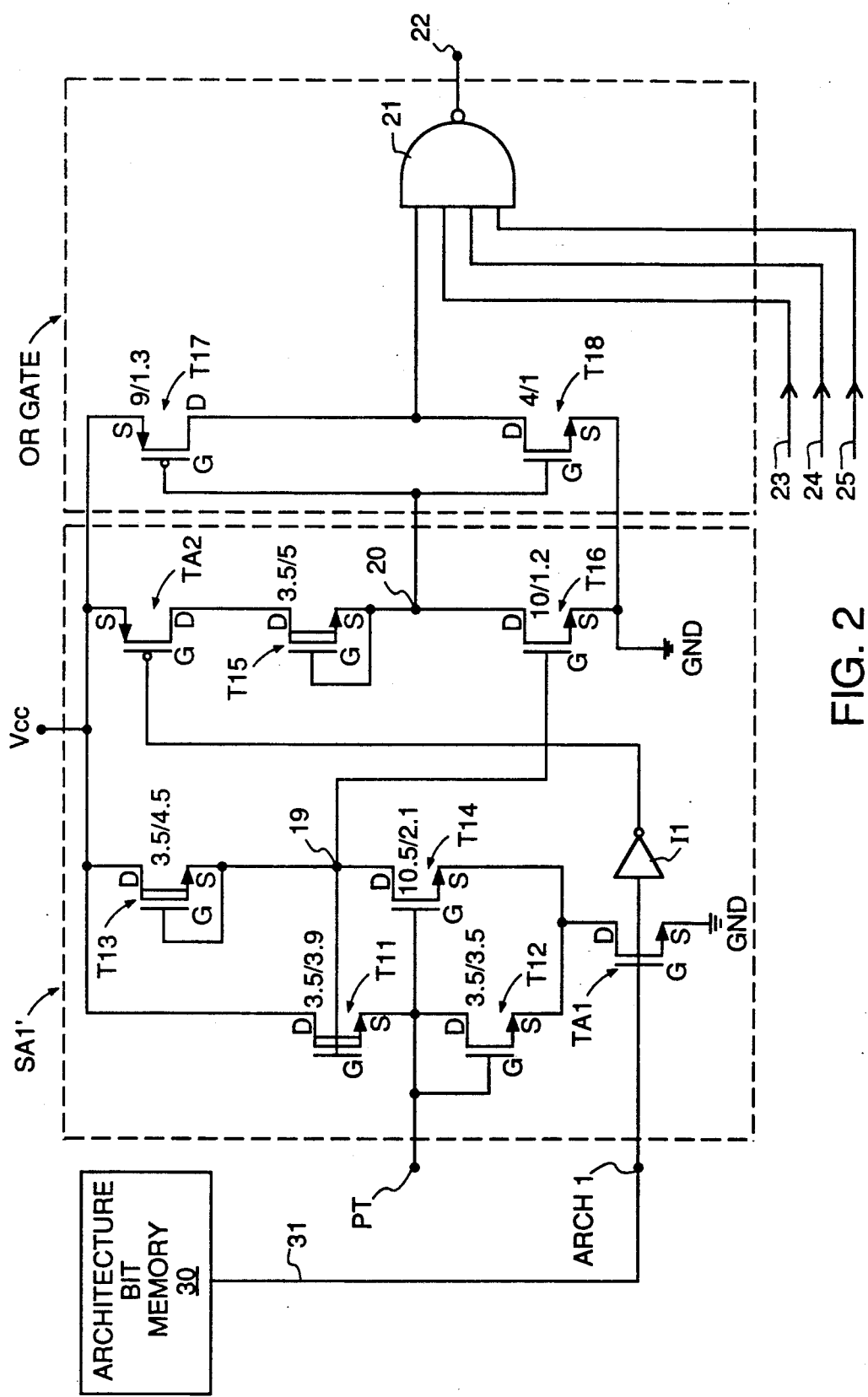
FIG. 2 illustrates one embodiment of the present invention which includes a sense amplifier circuit having a control circuit for selectively controlling the operation of the sense amplifier.

Turning to FIG. 2, a sense amplifier circuit in accordance with the preferred embodiment of the present invention is illustrated and indicated by reference character SA1'. Also illustrated in FIG. 2 is the associated OR gate for sense amplifier SA1'. Referring to FIG. 2, the product term input terminal for sense amplifier SA1' is indicated as PT, the power for sense amplifier SA1' is provided by VCC (which may be, for example, approximately plus 5 volts) with respect to ground terminal GND. Also provided included sense amplifier circuit SA1' is an input terminal labeled ARCH 1 which is utilized to control the operation of sense amplifier SA1'. In accordance with the present invention, in order to achieve reduced power consumption for a programmable logic device (PLD) using sense amplifiers, a control circuit is provided for each sense amplifier to permit selective disabling of the sense amplifier if its associated product term is not utilized in performing the logical function for which the PLD has been programmed. In response to a control signal supplied to the control circuit, the sense amplifier connected to the unused product term is conditioned such that it provides only a low output from its output terminal to avoid the indication of an incorrect logical result (which would occur if the sense amplifier were merely disabled) and the sense amplifier is prevented from consuming current. More particularly, when the programmable logic device utilizing the present invention is programmed, in addition to programming the memory cells utilized in the programmable AND array, architecture bits are also programmed into the PLD to control the operation of the sense amplifiers associated with each product term of the array. Referring to FIG. 2, architecture bit memory 30 is provided for storing a "1" or "0" for controlling the operation of sense amplifier SA1'. Based on whether or not the product term associated with sense amplifier SA'1 is being used to perform the logical function programmed into the PLD, a "1" or "0" is programmed into the architecture bit accordingly. Architecture bit memory 30 may take the form of any non-volatile memory means. The output from architecture bit memory 30 is provided to control terminal ARCH 1 over line 31, and as pointed out in detail below, the architecture bit may be set either high or low to enable or disable the sense amplifier SA1'. In a PLD using the present invention, an architecture bit memory (or storage location) is provided for each sense amplifier so that the operation of each sense amplifier can be separately controlled by programming the state of the architecture bit memory associated with the sense amplifier. Thus by having a memory location uniquely associated with each sense amplifier, complete flexibility in utilizing any number of the sense amplifiers in the PLD is possible. Accordingly, a PLD in accordance with the present invention may include memory locations for storing architecture bits to control the sense amplifiers utilized in the PLD. If the product term will be utilized in implementing the logical function being performed by the programmable logic device, then the architecture bit in the architecture bit memory for the sense amplifier associated with that product term line is set high and the sense amplifier operates in its normal fashion, providing an output at its output terminal which is a function of the input at the product term input terminal. If the product term is not required in implementing the logical function, the architecture bit in the architecture bit memory for the sense amplifier associated with the unused product term is set low, which will result in the sense amplifier always providing a low signal at its output.

Referring to FIG. 2, sense amplifier circuit SA1' includes a first stage which includes depletion mode field effect transistor T11 having its drain connected to VCC, and its source connected to input terminal PT. N-channel field effect transistor T12 has its drain and gate connected to input terminal PT and its source connected to the drain of N-channel first control transistor TA1. The source of first control transistor TA1 is connected to ground (GND) and its gate is connected to control terminal ARCH 1. To complete the first stage of sense amplifier SA1', N-channel depletion mode transistor T13 has its drain terminal connected to VCC, its gate and source connected in common and both connected to first stage output terminal 19. Additionally, the first stage of sense amplifier SA1' includes N-channel field effect transistor T14 having its drain connected to first stage output terminal 19, its source connected to the drain of first control transistor TA1 and its gate connected to product term input terminal PT. Feedback from first stage output terminal 19 to N-channel depletion mode transistor T11 is provided by connecting first stage output terminal 19 to the gate of transistor T11.

The second stage of sense amplifier circuit SA1' includes second control transistor TA2, which is a P-channel field effect transistor having its source connected to VCC, its gate connected to control input terminal ARCH 1 through buffer inverter I1. Also included in the second stage is N-channel field effect depletion mode transistor T15 having its drain connected to the drain of second control transistor TA2, its gate and source commonly connected, both of which are connected to output terminal 20 of sense amplifier SA1'. The final active device in the output stage is N-channel field effect transistor T16 which has its drain connected to output terminal 20 and its source connected to ground GND. The gate of transistor T16 is connected to first stage output terminal 19.

Figure 3:
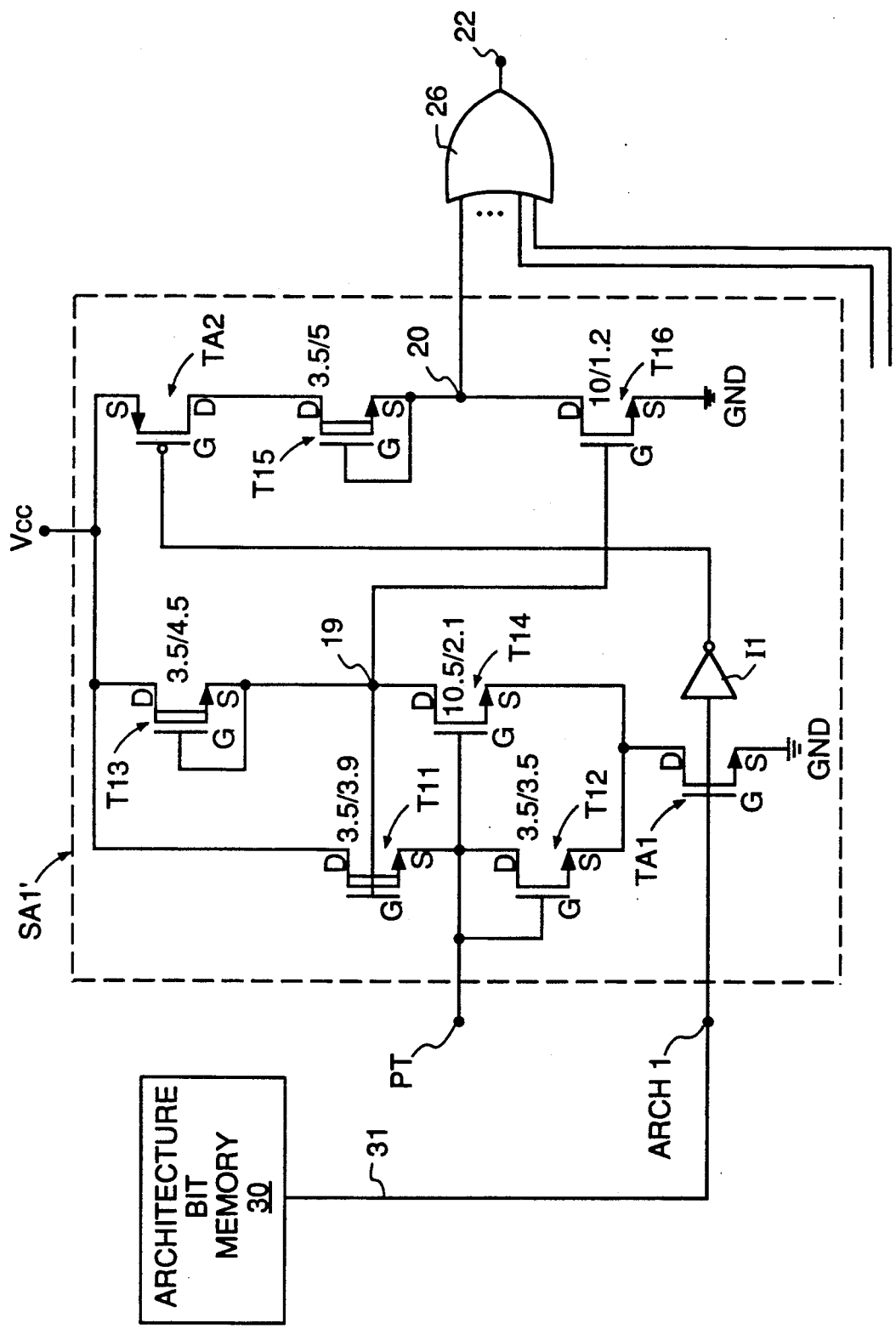
FIG. 3 illustrates an alternative embodiment of the present invention utilizing a control circuit to control the function of the sense amplifier circuit.

Also illustrated in FIG. 2 is additional circuitry which includes P-channel field effect transistor T17, N-channel field effect transistor T18 and NAND gate 21. Transistors T17 and T18, in conjunction with NAND gate 21, provide one portion of the logical OR function output to be provided at SUM output terminal 22. Additional inputs 23, 24 and 25 to NAND gate 21 are illustrated, however their associated sense amplifier circuits are not shown since they would be configured in the same manner as sense amplifier circuit SA1'. The ORing function for the PLD is preferably achieved by the circuitry as illustrated in FIG. 2. However, an alternative embodiment is illustrated in FIG. 3, which will be described more fully hereinafter.

It will be appreciated by those skilled in the art that transistors T17 and T18 form a CMOS inverter which achieves inversion of the signal into the associated input of NAND gate 21 from output terminal 20 of sense amplifier SA1'. As illustrated in FIG. 2, the gates of transistors T17 and T18 are connected to output terminal 20, the source of transistor T17 is connected to VCC, the drains of transistors T17 and T18 are commonly connected and the source of transistor T18 is connected to GND.

If the product term to which sense amplifier SA1' is connected will be functional in implementing the logical function programmed into the PLD, then architecture bit ARCH 1 will be programmed to be high and sense amplifier SA1' will function normally, thereby providing either a high or low signal at output terminal 20 depending on the input signal to input terminal PT. With the architecture input to terminal ARCH 1 high, first control transistor TA1 is on, thereby connecting the sources of transistors T12 and T14 to GND, thereby permitting transistors T11, T12, T13 and T14 to provide an output signal at first stage output terminal 19 which is the inverse of the signal at input terminal PT. The high input on ARCH 1 is inverted by buffer inverter I1 and the resulting low signal is provided to the gate of second control transistor TA2, which allows second control transistor TA2 to conduct and therefore transistor T15 is connected to VCC and the signal at output terminal 20 is effected by the input to the gate of transistor T16, which is connected to first stage output terminal 19.

With architecture input signal to terminal ARCH 1 high, sense amplifier SA1' will draw a predetermined amount of current without regard to whether input terminal PT is low or high. Under the condition that the input signal to terminal PT is low, transistor T14 is conducting weakly, which results in first stage output terminal 19 going high. The output at first stage output terminal 19 controls the conduction of transistor T16 since the gate of transistor T16 is connected to first stage output terminal 19. Accordingly, with input terminal PT low, first stage output terminal 19 is high and output terminal 20 will be low since transistor T16 is strongly conductive.

When the signal on input terminal PT is high, transistor T14 is caused to conduct more strongly, which lowers the voltage at first stage output terminal 19 to near 0 volts. Utilizing depletion mode feedback transistor T11 in the circuit makes it easier for terminal PT to stay high and first stage output terminal 19 to stay near 0 volts at the same time. Under this condition, we have a weak pull-up through depletion mode transistor T11 ready to be pulled down fast. On the other hand, when PT is low, first stage output terminal 19 stays high and this makes the depletion mode transistor T11 pulling up strong, making a fast low to high transition when the transistor on the product term are turned off. Our invention entitled "Sense Amplifier with Depletion Transistor Feedback" is disclosed and claimed in U.S. patent application Ser. No. 07/695,181 filed on the 3rd day of May, 1991, assigned to the assignee of the present application is hereby incorporated by reference in its entirety.

With the signal on sense amplifier input terminal PT high, the signal at first stage output terminal 19 will be low which will result in relatively weak conduction of transistor T16 thus raising the voltage on output terminal 20 to near VCC therefore resulting in a low input to NAND gate 21.

As pointed out above, since one sense amplifier is required for each product term in the programmable AND array, and since each sense amplifier draws current even though its associated product term is not being used in the logical function being implemented and the output of the sense amplifier is always low to avoid providing an incorrect result at the sum output of the OR gate, it is desirable to provide the architecture bit to disable the unused sense amplifier while maintaining its output at a low condition. To illustrate this aspect of the present invention, if sense amplifier SA1' is not required, the input to control terminal ARCH 1 is programmed low (approximately 0 volts). For the reasons to be explained below, this will result in sense amplifier SA1' consuming no current and output terminal 20 will be maintained in a low condition (approximately equal to ground). With a low input to control terminal ARCH 1, first control transistor TA1 is nonconducting and therefore the connection to ground for transistors T12 and T14 is cut off, and first stage output terminal 19 rises to approximately VCC since T13 is on. Thus with first stage output terminal 19 high, transistor T16 is on. The low input to control terminal ARCH 1 is inverted by buffer inverter I1 to a high which makes second control transistor TA2 nonconductive, which removes VCC from the drain of transistor T15. Under the foregoing conditions, there is no current flow in sense amplifier SA1'. The second desired result of maintaining output terminal 20 low is achieved since with first stage output terminal 19 high, transistor T16 is conductive and output terminal 20 is effectively at ground potential, providing a low input for the OR gate function for the unused product term.

Several variations to the circuit of sense amplifier SA1' may be utilized in practicing our invention, although the preferred circuit is as illustrated in FIG. 2. For example, although preferable sense amplifier performance is achieved when transistor T11 is a depletion mode transistor, our control circuit works equally as well for a sense amplifier of the type illustrated in FIG. 5 of the above-identified Turner patent which does not use a depletion mode feedback transistor. Also, it is preferable that load for transistors T13 and T15 be depletion mode transistors, other load impedances may be utilized instead of transistors T13 and T15.

An alternative embodiment of our invention is illustrated in FIG. 3. Sense amplifier circuit SA1' in FIGS. 2 and 3 are the same, however output terminal 20 in the embodiment illustrated in FIG. 3 is used to drive one input to OR gate 26. Other product term inputs to OR gate 26 are provided from their associated sense amplifiers (not illustrated). The SUM output is provided at SUM output terminal 22 and the logical result achieved is the same as that provided by the configuration in FIG. 2.

The foregoing illustrates two embodiments of the present invention, however various modifications and variations from these embodiments may be made by those skilled in the art without departing from the spirit and scope of the invention. It is of course also understood that the invention is not limited by the foregoing description and is defined by the following claims.

We claim:

1. An integrated programmable logic device for providing logical output signals in response to a plurality of logical input signals, comprising:
   a plurality of array lines for connection to a plurality of logical input signals;
   a plurality of product terms;
   an array of programmable memory cells arranged in rows and columns, each cell having conductive and nonconductive states and each cell being associated with respective ones of said array lines and said product terms for selectively connecting respective array lines to corresponding product terms in dependence on said cell state and the logical state of the logical array signals applied to the corresponding array line;

a plurality of sense amplifiers associated with respective ones of said product terms, each of said sense amplifiers having an input terminal connected to its associated product term for sensing the logical state of its respective product term, and each of said sense amplifiers having an output terminal for providing a logical output signal having first or second states which are indicative of the logical state of its respective product term; and wherein one or more of said sense amplifiers includes a control circuit having a control input terminal for receiving a control signal having first and second states, said control circuit, in response to receipt of a control signal having said first state, allowing said sense amplifier to provide at its output a logical signal of either said first or second state, and said control circuit, in response to receipt of a control signal of said second state, causing said sense amplifier to provide at its output a logical signal having only a first or second state wherein aid sense amplifier uses less current; and wherein each sense amplifier uses less current; and wherein each sense amplifier having a control circuit further comprises:

first and second power terminals for the application therebetween of an operating potential;

a first stage output terminal;

a first field effect transistor of first conductivity type having gate, drain, and source terminals;

a second field effect transistor of first conductivity type having gate, drain, and source terminals;

means coupling said first power terminal to said drain terminal of said first field effect transistor;

means coupling in common said source terminal of said first field effect transistor and said drain terminal of said second field effect transistor;

means coupling said input terminal to said commonly connected source terminal and drain terminals of said first and second field effect transistors respectively;

a third field effect transistor of first conductivity type having gate, drain and source terminals;

means coupling said source terminal of said third field effect transistor to said source terminal of said second field effect transistor;

means coupling said drain terminal of said third field effect transistor to said first stage output terminal;

first circuit means coupling said first stage output terminal to said first power terminal;

means coupling said gate terminal of said first field effect transistor to said first stage output terminal;

means coupling said gate terminal of said third field effect transistor to said input terminal;

a fourth field effect transistor of first conductivity type having source, gate and drain terminals;

means coupling said control input terminal to said gate terminal of said fourth field effect transistor;

means coupling said source terminal of said fourth field effect transistor to said second power terminal;

means coupling said drain of said fourth field effect transistor to said source terminals of said second and third field effect transistors;

a fifth field effect transistor of first conductivity type having drain, gate, and source terminals;

means coupling said drain terminal of said fifth field effect transistor to said sense amplifier output terminal;

means coupling said source terminal of said fifth field effect transistor to said second power terminal;

a sixth field effect transistor of second conductivity type having source, gate and drain terminals;

means coupling said source terminal of said sixth field effect transistor to said first power terminal;

second circuit means coupling said sense amplifier output terminal to said drain terminal of said sixth field effect transistor;

means coupling said gate terminal of said fifth field effect transistor to said first stage output terminal; and inverter means having a first terminal connected to said gate terminal of said fourth field effect transistor and a second terminal connected to said gate terminal of said sixth field effect transistor.

2. A programmable logic device according to claim 1, wherein said programmable logic device further includes memory means having a storage location for each sense amplifier control circuit for storing a control bit to provide a control signal for application to the control input terminal of the control circuit of its associated sense amplifier, and wherein said programmable logic device includes means coupling said storage location to the control input terminal of its associated sense amplifier control circuit.

3. The circuit according to claim 1, wherein said first circuit means comprises a seventh field effect transistor of first conductivity type and having a negative threshold voltage, said seventh field effect transistor having gate, drain and source terminals, and wherein said drain terminal of said seventh field effect transistor is connected to said first power terminal and said gate and source terminals of said seventh field effect transistor are connected to said first stage output terminal.

4. The circuit according to claim 3, wherein said second circuit means comprises an eight field effect transistor of first conductivity type and having a negative threshold voltage, said eighth field effect transistor having gate, drain and source terminals, and wherein said drain terminal of said eighth field effect transistor is connected to said drain terminal of said sixth field effect transistor and said gate and source terminals of said eighth field effect transistor are connected to said sense amplifier output terminal.

5. The circuit according to claim 1, wherein said first field effect transistor has a negative threshold voltage.

6. The circuit according to claim 3, wherein said first field effect transistor has a negative threshold voltage.

7. The circuit according to claim 4, wherein said first field effect transistor has a negative threshold voltage.

8. The circuit of claim 1, wherein said first field effect transistor comprises a depletion mode transistor.

9. The circuit of claim 3, wherein said first field effect transistor comprises a depletion mode transistor.

10. The circuit of claim 4, wherein said first field effect transistor comprises a depletion mode transistor.

* * * * *